United States Patent
Kruse

(10) Patent No.: US 6,530,070 B2
(45) Date of Patent: Mar. 4, 2003

(54) METHOD OF CONSTRAINING NON-UNIFORM LAYOUTS USING A UNIFORM COORDINATE SYSTEM

(75) Inventor: James W. Kruse, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 50 days.

(21) Appl. No.: 09/822,904

(22) Filed: Mar. 29, 2001

(65) Prior Publication Data

US 2002/0178430 A1 Nov. 28, 2002

(51) Int. Cl.[7] .................................................. G06F 17/50
(52) U.S. Cl. ................................. 716/16; 716/10; 716/8
(58) Field of Search ............................ 716/16, 1, 2, 3, 716/4, 5, 6, 7, 8, 9, 10, 11, 12, 13, 14, 15, 17, 18, 19, 20, 21

(56) References Cited

U.S. PATENT DOCUMENTS

| | | | | |
|---|---|---|---|---|
| 4,295,149 A | * | 10/1981 | Balyoz et al. | 357/45 |
| 5,350,704 A | * | 9/1994 | Anderson et al. | 437/51 |
| 5,784,289 A | * | 7/1998 | Wang | 716/8 |
| 6,237,129 B1 | * | 5/2001 | Patterson et al. | 716/8 |
| 6,341,364 B1 | * | 1/2002 | Wever et al. | 716/7 |
| 6,389,379 B1 | * | 5/2002 | Lin et al. | 703/14 |
| 6,408,422 B1 | * | 6/2002 | Hwang et al. | 716/3 |

OTHER PUBLICATIONS

"Xilinx Libraries Guide", published Oct. 1995, available from Xilinx, Inc., 2100 Logic Drive, San Jose, CA 95124, pp. 4–71 to 4–97.

Xilinx's "The Programmable Logic Data Book 2000", available from Xilinx, Inc., 2100 Logic Drive, San Jose, California 95124, pp. 3–75 through 3–96.

Xilinx's "The Programmable Logic Data Book 1998", available from Xilinx, Inc. 2100 Logic Drive, San Jose, California 95124, pp.4–5 through 4–69.

Xilinx's "Virtex–II Platform FPGA Handbook", available from Xilinx, Inc. 2100 Logic Drive, San Jose, California 95124, published Jan. 2001, pp. 33–95.

\* cited by examiner

Primary Examiner—Tuan T. Lam
Assistant Examiner—Hai L. Nguyen
(74) Attorney, Agent, or Firm—Lois D. Cartier

(57) ABSTRACT

A method of designating circuit element positions using uniform coordinate systems that can be applied to non-uniform logic arrays. A "site map" is constructed comprising a uniform array of "sites". A uniform coordinate system is applied to the site map. The various logic blocks, which may be of different types and sizes, are mapped to the site array. The result is the imposition of a uniform coordinate system on a non-uniform logic array, using the intervening abstraction of a site array. Because the site array is uniform, a relative location constraint applied to a site within the site array retains its validity regardless of the location of the site within the site array, even when the relative location constraints are normalized.

21 Claims, 9 Drawing Sheets

XC4000 FPGA
(Prior Art)

Virtex FPGA
(Prior Art)

Virtex-II FPGA

METHOD OF CONSTRAINING NON-UNIFORM LAYOUTS USING A UNIFORM COORDINATE SYSTEM

FIELD OF THE INVENTION

The invention relates to Field Programmable Gate Arrays (FPGAs). More particularly, the invention relates to methods for constraining circuit element positions in structured FPGA layouts.

BACKGROUND OF THE INVENTION

Programmable ICs are a well-known type of digital integrated circuit that may be programmed by a user to perform specified logic functions. One type of programmable IC, the field programmable gate array (FPGA), typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration data may be read from memory (e.g., an external PROM) or written into the FPGA by an external device. The collective states of the individual memory cells then determine the function of the FPGA.

One type of FPGA, the Xilinx XC4000™ Series FPGA, is described in detail in pages 4-5 through 4-69 of the Xilinx 1998 Data Book entitled "The Programmable Logic Data Book 1998", published in 1998 and available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

FIG. 1A shows a simplified diagram of an XC4000-Series FPGA 100. The FPGA includes a uniform array of CLBs surrounded by a ring of IOBs, as described above. (The exemplary arrays herein are generally shown smaller than actual logic arrays in order to facilitate clear and simple drawings, but actual logic arrays typically include many more rows and columns of elements.) The CLB array typically includes variations in routing, for example at the outer edges and/or the center of the array, but the CLB array is considered uniform for purposes of this discussion because all of the logic blocks are similar. Each CLB includes two 4-input function generators, one 3-input function generator, and two flip-flops, in addition to other logic.

A more advanced FPGA is the Xilinx Virtex® FPGA, which in addition to the CLBs includes blocks of Random Access Memory (RAM). The Xilinx Virtex-II FPGA is described in detail in pages 3-75 through 3-96 of the Xilinx 2000 Data Book entitled "The Programmable Logic Data Book 2000", published Apr., 2000, available from Xilinx, Inc., 2100 Logic Drive, San Jose, Calif. 95124, which pages are incorporated herein by reference.

FIG. 1B shows a simplified diagram of a Virtex FPGA 110. The FPGA includes a uniform array of CLBs, flanked by two columns of RAM blocks, with a ring of IOBs around the CLBs and RAM blocks. The Virtex CLB is organized into two functionally similar blocks called "slices", each of which includes two 4-input function generators and two flip-flops, in addition to other logic. The RAM blocks, of course, include different elements and are larger than the CLBs.

An even more advanced FPGA is the Xilinx Virtex®-II FPGA, which in addition to the CLBs includes blocks of Random Access Memory (RAM) and blocks implementing multiplier functions. (The Xilinx Virtex-II FPGA is described in detail in pages 33–75 of the "Virtex-II Platform FPGA Handbook", published January, 2001, available from Xilinx, Inc., 2100 Logic Drive, San Jose, Calif. 95124, which pages are incorporated herein by reference.) The RAM and multiplier blocks are interspersed within the CLB array, forming a non-uniform array of logic blocks, as shown in FIG. 1C.

FIG. 1C shows a simplified diagram of a Virtex-II FPGA 120. The FPGA includes an array of CLBs, with columns of RAM blocks and multiplier blocks inserted within the CLB array. The resulting logic array is therefore non-uniform in nature, including three different kinds of logic blocks. The logic array is surrounded by a ring of IOBs, the IOB ring also including Digital Clock Manager (DCM) logic blocks. The Virtex-II FPGA also includes other types of logic blocks, but these are omitted from FIG. 1C for the sake of clarity. The Virtex-II CLB is organized into four slices, each of which includes two 4-input function generators and two flip-flops, in addition to other logic. Each CLB also includes two tristate buffers. The RAM blocks and multiplier blocks include different elements from the CLBs. The RAM and multiplier blocks are designed such that the height of each block is a multiple of the CLB height.

As FPGA designs increase in complexity, they reach a point at which the designer cannot deal with the entire design at the gate level. Where once a typical FPGA design comprised perhaps 5,000 gates, FPGA designs with over 100,000 gates are now common. To deal with this complexity, circuits are typically partitioned into smaller circuits that are more easily handled. Often, these smaller circuits are divided into yet smaller circuits, imposing on the design a multi-level hierarchy of logical blocks.

Libraries of predeveloped blocks of logic have been developed that can be included in an FPGA design. Such library modules include, for example, adders, multipliers, filters, and other arithmetic and DSP functions from which complex designs can be readily constructed. The use of predeveloped logic blocks permits faster design cycles, by eliminating the redesign of duplicated circuits. Further, such blocks are typically well tested, thereby making it easier to develop a reliable complex design.

To offer the best possible performance, some library modules have a fixed size and shape, with relative location restrictions on each element. One type of module having a fixed size and shape is the Relationally Placed Macro (RPM) from Xilinx, Inc. RPMs are described in pages 4-96 and 4-97 of the "Libraries Guide" (hereinafter referred to as the "Xilinx Libraries Guide"), published October 1995 and available from Xilinx, Inc., which pages are incorporated herein by reference. An RPM is a schematic that includes constraints defining the order and structure of the underlying circuits. The location of each element within the RPM is defined relative to other elements in the RPM, regardless of the eventual placement of the RPM in the overall design. For example, an RPM might contain 8 flip-flops constrained to be placed into four XC4000 CLBs in a vertical column. The column of four CLBs can then be placed anywhere in any XC4000 Series FPGA.

Relative CLB locations in an RPM are specified using a Relative Location Constraint called "RLOC". RLOC constraints are described in detail in pages 4-71 through 4-95 of the Xilinx Libraries Guide, which pages are incorporated herein by reference. FIG. 2A shows how RLOC constraints are related to physical location in an array of XC4000 Series logic blocks, and how they are associated with assigned coordinates. Elements having an RLOC value of R0C0 are located in a given CLB corresponding to the (0,0) coordinate location. The next CLB "below" the (0,0) CLB is designated as R1C0, corresponding to the (0,1) coordinate location. When the FPGA design is mapped and placed by the FPGA implementation tools (prior to the final routing step), these RLOC constraints are referenced and, in effect, make the RPM a "jigsaw puzzle piece" to be fitted into the FPGA along with other elements and/or modules. Although the RPM has a rigid size and shape, other logic can be placed within the borders of the RPM.

Logic can also be mapped to elements within the logic block. For example, the function generators and flip-flops inside a CLB can be directly addressed using RLOC constraints. For example, in an XC4000 Series FPGA, the "F" function generator within the (0,0) CLB is addressed by assigning the constraint "RLOC=R0C0.F" to the logic element assigned to that location. The "Y" flip-flop in the same CLB is addressed by assigning the constraint "RLOC=R0C0.FFY", and so forth.

The exact numbers assigned using RLOC constraints are unimportant in an FPGA with a uniform array of logic blocks. Only the relative values of the RLOC constraints are important. For example, if a user generates an RPM using two vertically adjacent CLBs at a first location, and then generates an identical RPM using two vertically adjacent CLBs at a second location, the resulting RPMs will be exactly the same, due to a process called "normalization". Normalization is the process whereby the RPM creation software (provided by the FPGA manufacturer) scans the selected logic blocks, looking for the RLOC with the lowest row and column number. The RPM creation software then subtracts the lowest row and column numbers from each RLOC, resulting in an RPM where the upper left corner has assigned relative location RLOC=R0C0. Normalization allows a user to create an RPM from any logic implemented anywhere in a logic array. An example of normalization is now described using the CLB array shown in FIG. 2A.

FIG. 2A shows a uniform CLB array 200, such as those in an XC4000 Series FPGA. A first circuit is implemented using two CLBs at coordinates (0,0) and (0,1), forming area 201. A second, identical circuit is implemented using two CLBs at coordinates (2,2) and (2,3), forming area 202. When the second circuit is selected and the RPM creation software is invoked, the software scans the selected logic blocks and determines that the lowest R,C coordinates are (2,2). The value of 2 is then subtracted from each column number and each row number of the selected logic blocks. The resulting RPM thus includes CLBs with relative locations (0,0) and (0,1), exactly as does the RPM resulting from the first circuit.

Although this method of specifying relative locations is a useful way to represent positions in a uniform array, when the array of logic blocks is non-uniform the representation is less straight-forward. In a non-uniform array where all logic blocks are the same size regardless of their differing functions, the above-described scheme still works as desired, provided the placement software knows what logic elements can be placed in which locations. However, in a non-uniform scheme including blocks of different sizes, locations must be specified in some other manner. For the Virtex FPGA, the locations of CLBs are specified using a first numerical coordinate scheme, while RAM blocks are specified using a second numerical coordinate scheme independent from the first one, as shown in FIG. 2B.

FIG. 2B shows an array 210 of logic blocks in a Virtex FPGA. A centrally-located array of CLBs has assigned locations the same as those shown in FIG. 2A. The flanking columns of RAM blocks have locations specified independently from those of the CLB array, but in a similar manner. (The numbers and relative sizes of CLBs and RAM blocks in the figures herein are not representative of actual Virtex and Virtex-II FPGAs.)

In the logic array of FIG. 2B, an RPM implemented using only CLBs can be defined in the same manner as the example in FIG. 2A, at any point in the array, and is normalized by the RPM creation software. An RPM including only RAM blocks can be defined similarly, and normalization operates correctly. However, an RPM including both types of logic blocks does not normalize correctly. Referring to FIG. 2B, an RPM created in area 212 of array 210 would ideally result in the same RPM as if it were created in area 211. However, this is not the case, as shown by the following example.

A first circuit is implemented in area 211 of array 210, using one RAM block at coordinates (0,0) and two CLBs at coordinates (0,0) and (0,1). When converted to an RPM, this first RPM has the same shape as area 211. A second, identical circuit is implemented in area 212, using one RAM block at coordinates (0,1) and two CLBs at coordinates (0,2) and (0,3). When the second circuit is selected and the RPM creation software is invoked, the software scans the selected logic blocks and determines that the lowest R,C coordinates are (0,1). The value of 1 is then subtracted from each row number of the selected logic blocks, while the column numbers remain unchanged. The resulting RPM thus includes one RAM block with relative coordinates (0,0) and two CLBs with relative locations (0,1) and (0,2). While logically correct, this second RPM does not have the shape of the original area 212. Instead, it includes, for example, the logic blocks in area 213. Therefore, creating RPMs including logic blocks of more than one type is a problematic process.

This difficulty is augmented in the Virtex-II FPGA, which has three types of logic blocks in the logic array. Using the previously-described method of designating relative locations, each type of logic block would have a separate coordinate system, as shown in FIG. 2C. The situation is further complicated if the logic array is defined to include the ring of IOBs shown in FIG. 1C, which also includes the Digital Clock Manager (DCM) blocks and other types of blocks not shown in FIG. 1C.

An RPM can be moved from place to place in a non-uniform logic array, provided that the new location includes the correct type of logic block in the correct positions for the RPM logic. However, the processes of defining and modifying an RPM in a non-uniform logic array are subject to the limitations described above. It is therefore desirable to provide methods for specifying circuit element positions in a uniform manner that can be applied to any logic block in a non-uniform logic array.

SUMMARY OF THE INVENTION

The invention provides methods and software for designating circuit element positions using uniform coordinate systems that can be applied to non-uniform logic arrays. A "site map" is constructed comprising a uniform array of "sites". A uniform coordinate system is then applied to the site map. The various logic blocks—for example, the slices, tristate buffers, RAM blocks, and multiplier blocks of the Xilinx Virtex-II FPGA—are mapped to the site array. The result is the imposition of a uniform coordinate system on a non-uniform logic array, using the intervening abstraction of a site array. The logic blocks in the logic array may be of different types and sizes.

Because the site array is uniform, a relative location constraint applied to a site within the site array retains its validity regardless of the location of the site within the site array, even when the relative location constraints are normalized. However, during the subsequent placement operation the implementation software must take into account which sites support which logic blocks, so that logic blocks are only mapped to sites that support the implemented functions.

BRIEF DESCRIPTION OF THE DRAWINGS

The present invention is illustrated by way of example, and not by way of limitation, in the following figures, in which like reference numerals refer to similar elements.

FIG. 2C shows an array of CLBs, RAM blocks, and multiplier blocks in a Virtex-II FPGA, with associated coordinates applied according to the system of FIG. 2B.

FIG. 3B shows the logic array of CLBs, RAM blocks, and multiplier blocks from FIG. 2C, assigned to the site map of FIG. 3A and its associated set of uniform coordinates.

FIG. 4 shows a Xilinx XC2V40 FPGA device mapped to a site map according to a method of the present invention.

DETAILED DESCRIPTION OF THE DRAWINGS

The present invention has been found to be particularly applicable and beneficial when applied to field programmable gate arrays (FPGAs) including non-uniform arrays of logic blocks. While the present invention is not so limited, an appreciation of the present invention is presented by way of specific examples showing the application of the invention to the Virtex-II FPGA. However, it will be apparent to one skilled in the art that the present invention can be applied to other programmable logic devices including logic arrays. It will further be apparent to one skilled in the art that the present invention can be applied to any type of non-uniform array, including those not included in a programmable logic device.

Figure 1A:
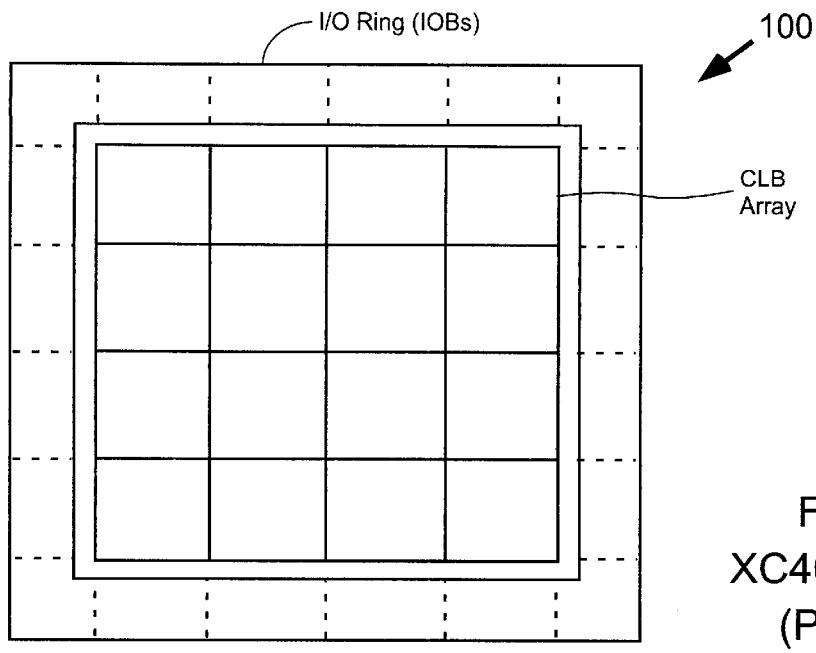
FIG. 1A shows a simplified diagram of an XC4000-Series FPGA.
Figure 1B:
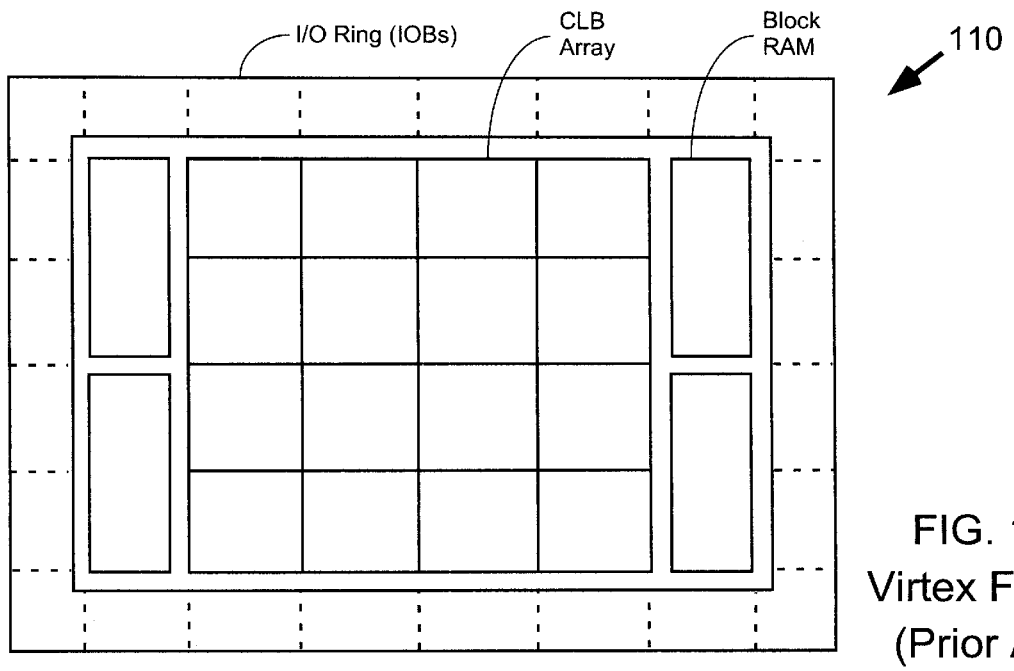
FIG. 1B shows a simplified diagram of a Virtex FPGA.
Figure 1C:
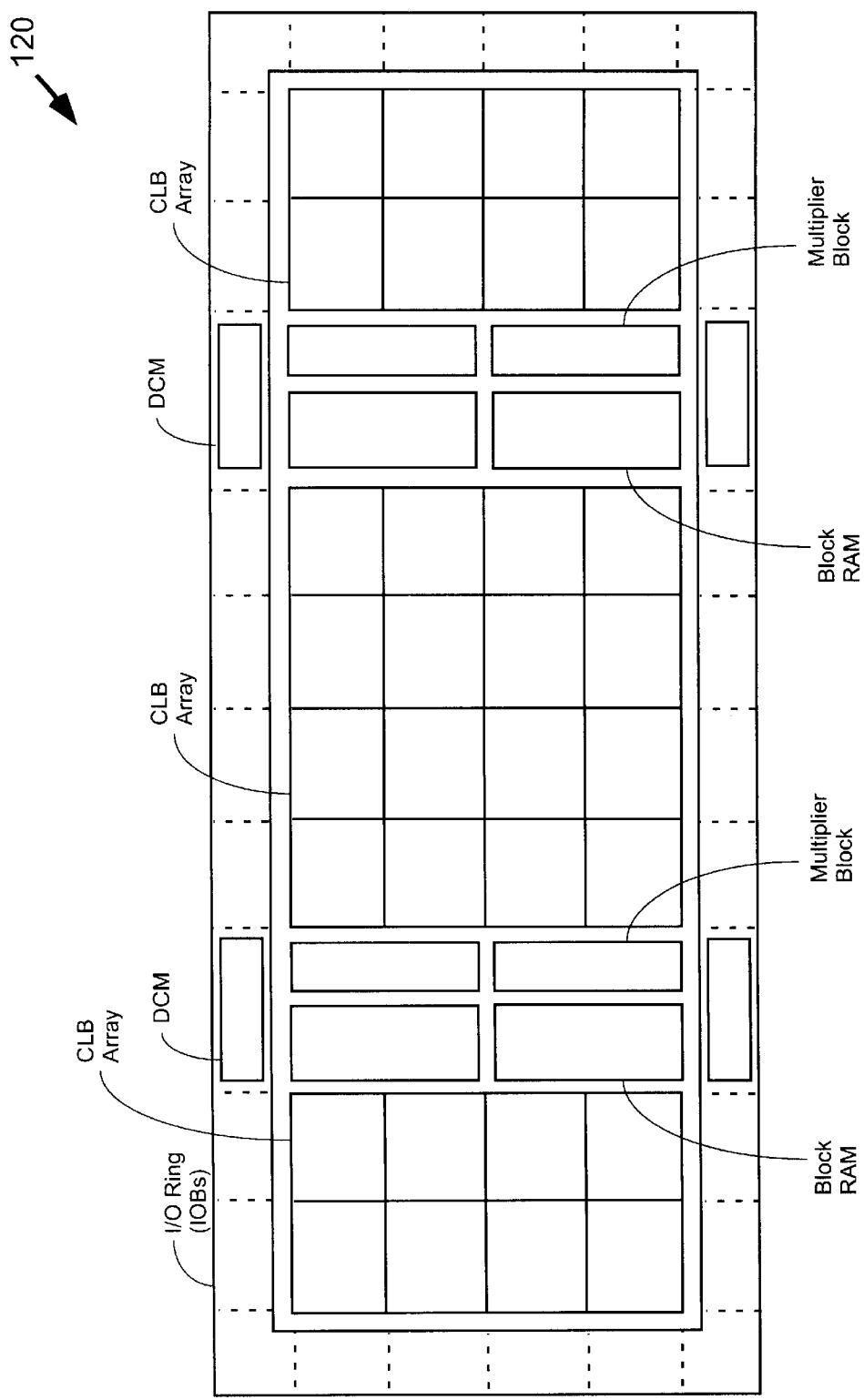
FIG. 1C shows a simplified diagram of a Virtex-II FPGA.
Figures 2A, 2B:
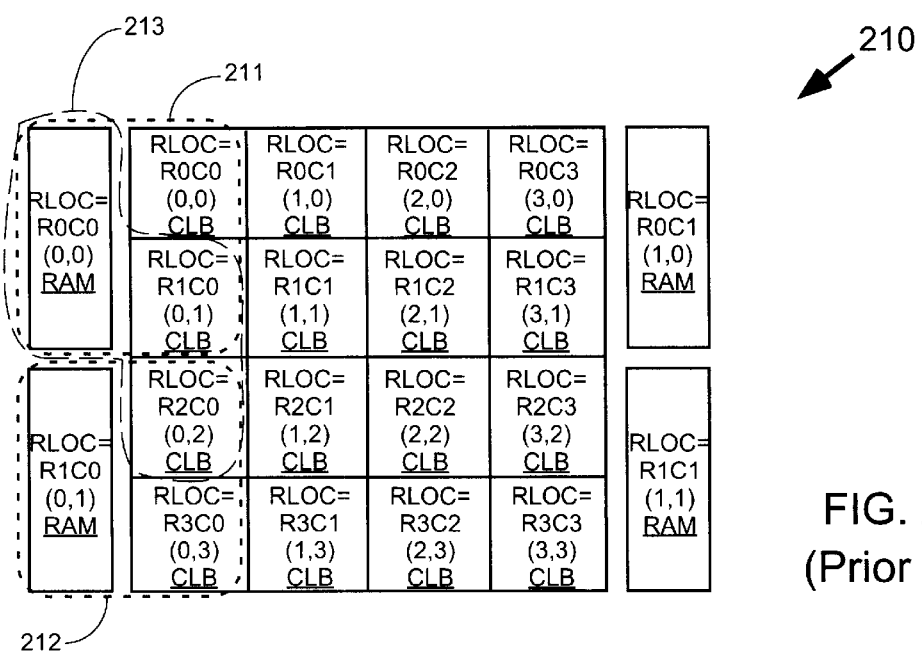
FIG. 2A shows a uniform CLB array, such as those in an XC4000 Series FPGA, and an associated coordinate system.
FIG. 2B shows an array of CLBs and RAM blocks in a Virtex FPGA, and an associated coordinate system.
Figure 3A:
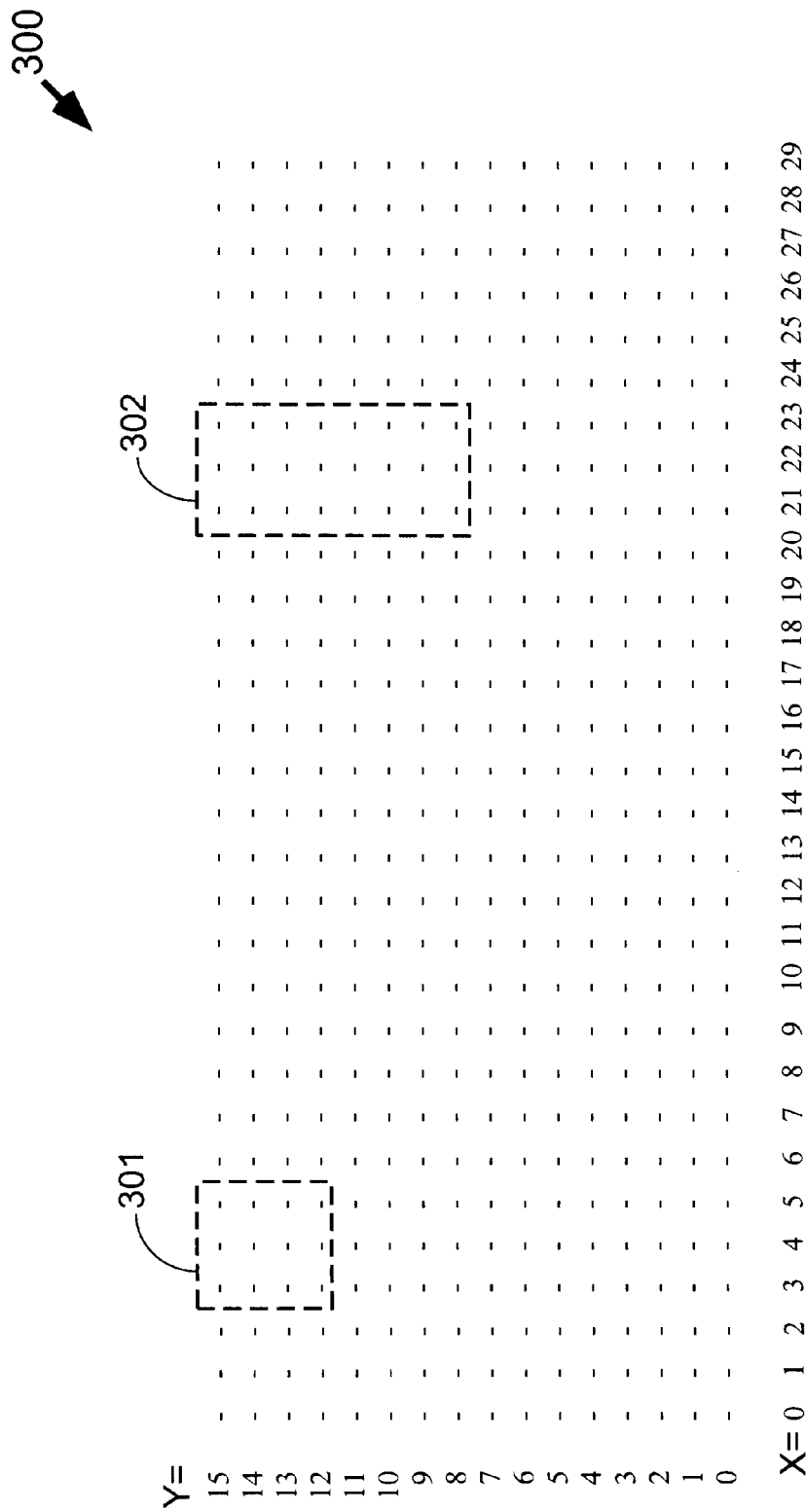
FIG. 3A shows a site map created in accordance with the present invention, with an associated set of uniform X,Y coordinates.

To map a non-uniform array in a uniform fashion, a "site map" is created that corresponds in a desired fashion to the non-uniform logic array. Generally, a logic block in the logic array corresponds to an array of sites in the site map. For example, FIG. 3A shows a site map 300 that can be used to represent the non-uniform logic array 220 shown in FIG. 2C. When site map 300 is applied to logic array 220, each CLB corresponds to a 4×3 array of sites. For example, site area 301 in site array 300 represents the CLB at location (1,0) in logic array 220. However, in this embodiment of the invention the RAM and multiplier blocks share a site area, e.g., area 302. The reason for this shared site area is that in this example the width of the combined RAM and multiplier blocks is the same as the width of one CLB block. Therefore, combining the RAM and multiplier blocks into one site area simplifies the FPGA implementation software. In this example, the RAM and multiplier blocks together are the width of one CLB and the height of two CLBs. Therefore, the site area 302 for one RAM block and one multiplier block includes 8×3 sites.

The site map has an associated uniform coordinate system. In the example of FIG. 3A, the uniform coordinate system is the well-known X,Y coordinate system. However, any other uniform coordinate system could be used. For example, the R,C (row, column) coordinate system used in FIGS. 2A–2C could be used. Regardless of the coordinate system used, each site in the site array has a specific, uniformly-numbered location. For example, using the X,Y coordinate system as shown in FIG. 3A, site area 301 includes sites (3,12), (3,13), (3,14), (3,15), (4,12), (4,13), (4,14), (4,15), (5,12), (5,13), (5,14), and (5,15).

The number of sites in the site area and the aspect ratio of the site area for each logic block are at the discretion of the person assigning the coordinate system. They are preferably selected to simplify the implementation software without creating an inordinately large site map.

Figure 2C:
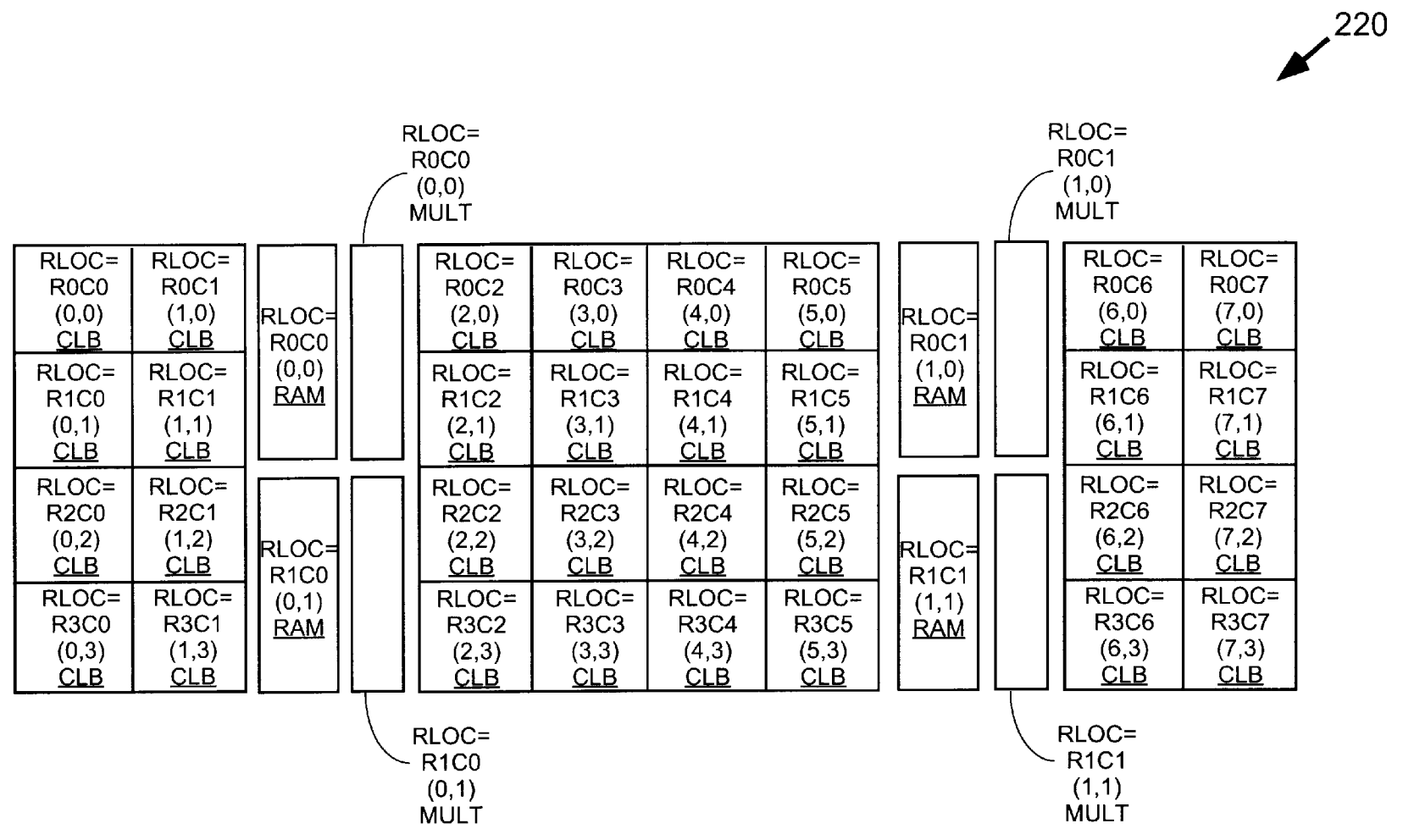
Figure 3B:
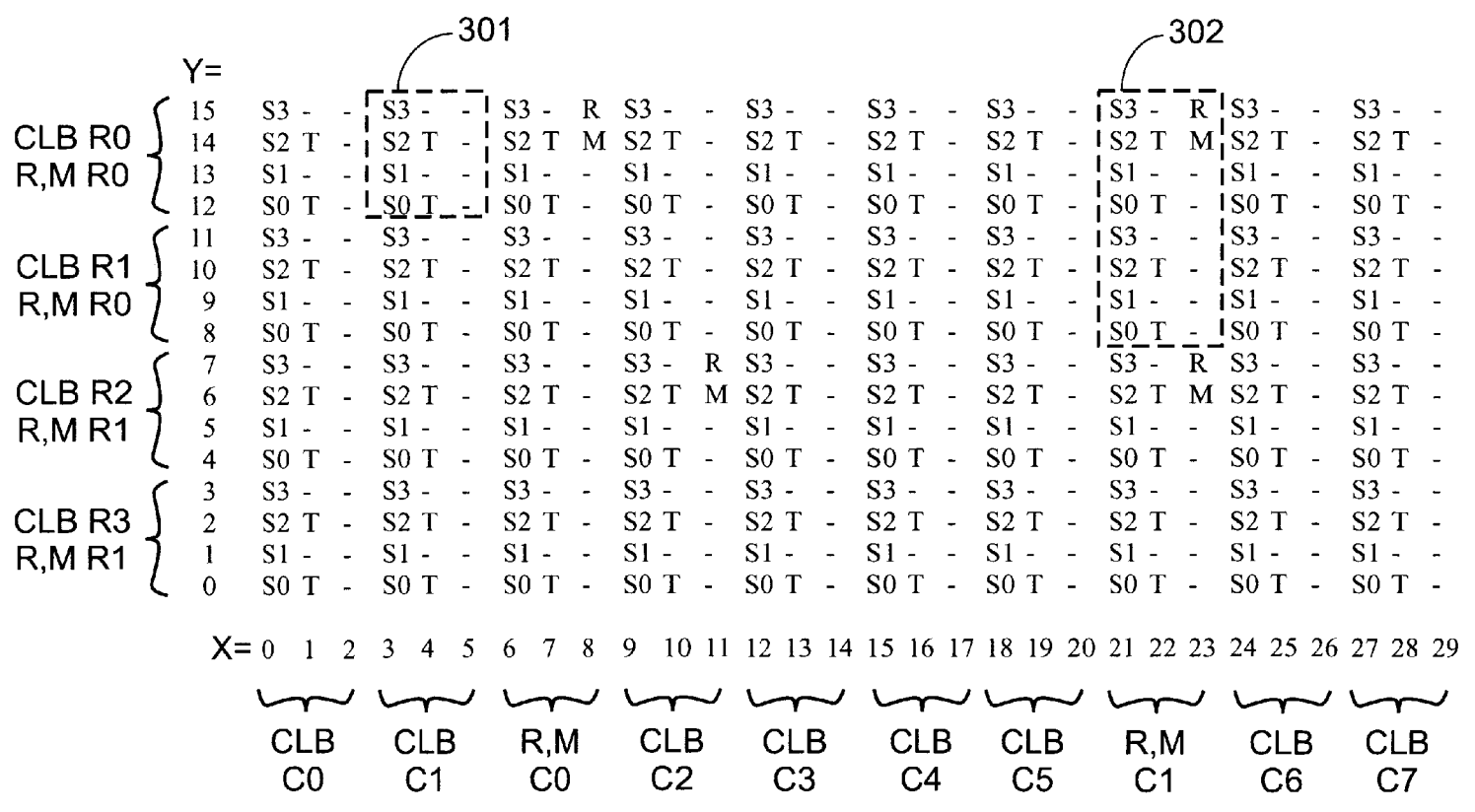

FIG. 3B shows the site map of FIG. 3A after the logic blocks of FIG. 2C have been assigned to the sites in the site map. Note that the CLBs have been "broken down" into smaller logic blocks within the CLB (e.g., see site area 301). These logic blocks are individually addressable elements within the CLB. For example, a Virtex-II CLB includes four "slices", as described above. These slices (S0–S3) are assigned to individual sites. Similarly, the two tristate buffers in each CLB also have assigned sites. Assigning specific sites to these elements makes it easy to specify locations for logic targeted to these elements, simply by specifying the coordinates of the site. For example, to assign a circuit element to Slice 0 of the CLB in site area 301, the relative location constraint "RLOC=SLICE_X3Y12" is attached to the element. If an absolute location is desired, rather than a relative location, the absolute location constraint "LOC=SLICE_X3Y12" is used.

Because the coordinate system is uniform, the normalization process when an RPM is created does not change the shape of the original circuit implementation. In other words, an RPM can be created at any location in the non-uniform array, and the relative positions of the blocks in the RPM are the same, unlike in the example described with reference to FIG. 2B.

Of course, an RPM can only be placed in locations that support that RPM. For example, an RPM that includes CLBs and a RAM block cannot be placed in a portion of the logic array that does not include a RAM block in the relative location specified in the RPM. In one embodiment, the implementation software scans the mapped site array prior to placing any RPM, and locates potential site areas having the correct types of logic blocks available to match the relative placements in the RPM. Only these valid site areas are considered during the placement process.

The number of sites assigned to each logic block, the aspect ratio of the site area, and the location of each element within the site area can vary at the discretion of the person creating the site map. For example, site area 301 could have taken on any of the aspects 301a–c shown in FIG. 3C. The location of the element site within the site area need not correspond to the actual physical location of the element within the logic block. The selection is generally made based on what will most simplify the FPGA implementation software. For example, the slice element sites were assigned as shown in site area 301 because the shift register in the Virtex-II CLB flows from slice S3 through slices S2 and S1 to slice S0. Site area 301a shows another possible implementation, which more closely corresponds to the carry chain logic in the Virtex-II CLB (two carry chains, S1-S0 and S3-S2). Site areas 301b and 301c show other possible implementations.

Site area 302 includes the RAM and multiplier blocks. The tristate buffer element sites have been retained, because the tristate buffers are still available in these blocks. However, note that in this embodiment the slice element sites are also retained, although these resources are not available in the RAM and multiplier blocks. Again, this is a choice that was made for the sake of the FPGA implementation software. In other embodiments, only elements actually available in the logic block are mapped to the site map.

Figure 3D:
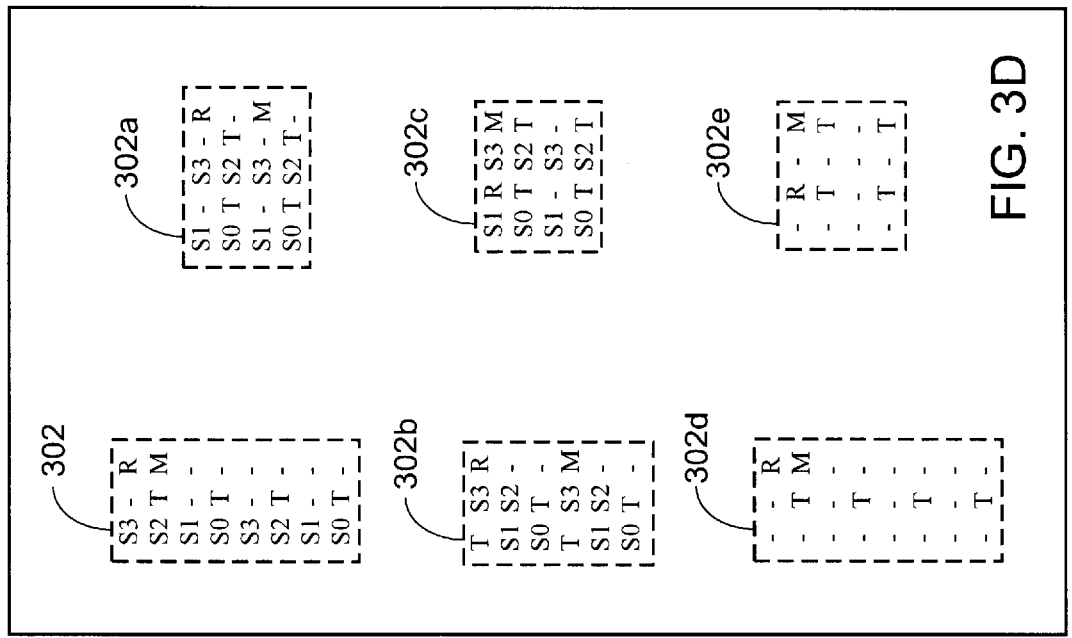
FIG. 3D shows site area 302 of FIG. 3B, and examples of ways in which the associated RAM and multiplier blocks could be mapped to sites in different site arrays.
Figure 3C:
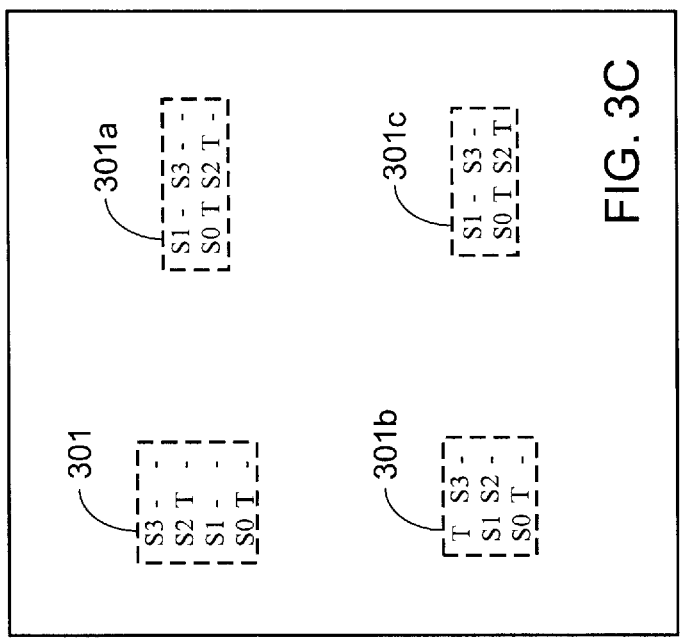
FIG. 3C shows site area 301 of FIG. 3B, and examples of ways in which the associated CLB could be mapped to sites in different site arrays.

FIG. 3D shows various aspects 302a–e that could have been assigned to site area 302.

Figure 4:
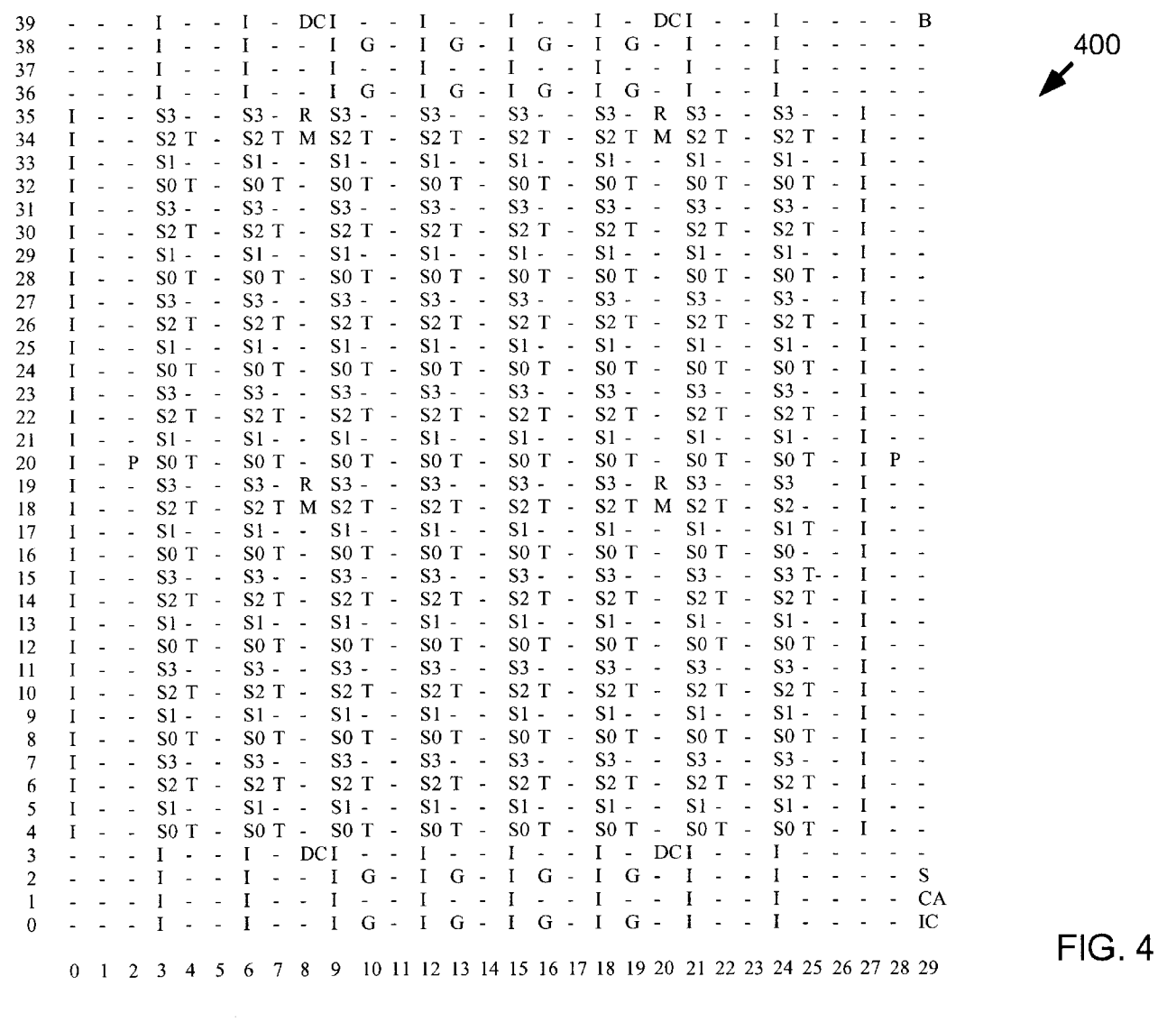

FIG. 4 shows an actual site map 400 for an XC2V40 Virtex-II FGPA available from Xilinx, Inc., with the various logic blocks mapped to the site map. The site map uses an X,Y coordinate system, with X-axis values varying from 0 to 29, and Y-axis values varying from 0 to 39. Table 1 shows the various elements that are mapped to sites in site map 400. In the actual Virtex-II device, as shown in FIG. 4, the RAM and multiplier blocks together are 4 CLBs high and the same width as one CLB. Note that when the methods of the invention are used, the site map can be extended to cover not just the non-uniform logic array in the center of the IOB ring, but also the IOB ring itself. Thus, an entire FPGA can be mapped to a single uniform coordinate system.

TABLE 1

| Symbol | Element | Location |
|---|---|---|
| S0, S1, S2, S3 | Slices S0, S1, S2, S3 | CLB |
| CA | Capture FF Data for Readback | IOB ring |
| DC | Digital Clock Manager | IOB ring |
| G | Global Clock Buffer | IOE ring |
| I | IOB | I/O block |
| IC | Capture I/O Data for Readback | IOB ring |
| B | Boundary Scan Control | IOB ring |
| M | Multiplier | Multiplier block |
| P | PCI Logic | IOB ring |
| R | Block RAM | RAM block |
| S | Startup Logic | IOB ring |
| T | Tristate Buffer | CLE, RAM block, Multiplier block |

Figure 5:
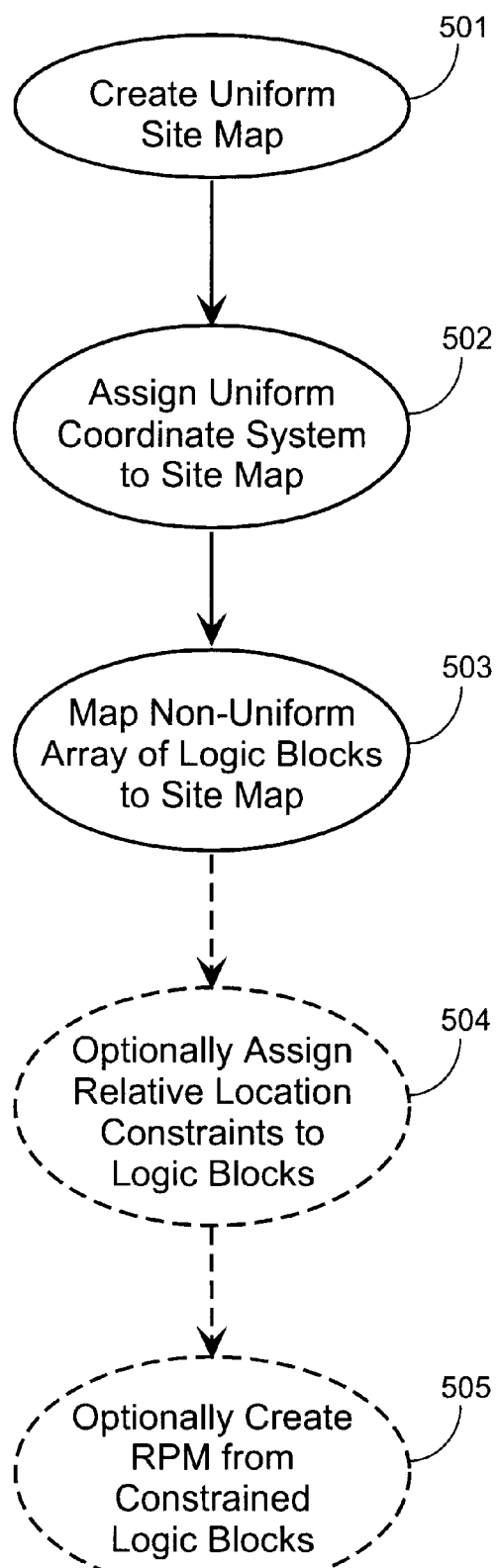
FIG. 5 is a flow diagram showing a method of designating positions in a non-uniform array using a uniform coordinate system according to one aspect of the present invention.

FIG. 5 is a flow diagram illustrating a method of designating positions in a non-uniform array using a uniform coordinate system according to a first aspect of the present invention. In step 501, a uniform site map is created. In step 2, a uniform coordinate system is assigned to the site map, such that each site in the site map has a unique set of coordinates. FIG. 3A shows an example of a uniform site map having a uniform coordinate system. In step 503, a non-uniform array of logic blocks is mapped to the site array, such that each logic block is mapped to one site. In one embodiment, the logic blocks include CLBs, RAM blocks, and multiplier blocks. In another embodiment, the logic blocks include slices and tristate buffers. As a result of the mapping step, each logic block can be addressed using the uniform coordinate system.

In optional step 504, relative location constraints are assigned to two or more logic blocks in the process of creating an RPM from the constrained logic blocks. In further optional step 505, an RPM is created from the constrained logic blocks. The shape of the resulting RPM is independent of the location in the array of the constrained logic blocks, even if the RPM creation process includes a normalization of the specified coordinates.

To simplify the location specification process for the user, a graphical tool is preferably provided that informs the user of the coordinates of each logic block. For example, the FPGA implementation tools from Xilinx, Inc., include a graphical editor. Preferably, when a user views this graphical editor and places a cursor on one element (or logic block) in the display, the uniform coordinates of the element are displayed on the screen. For example, placing the cursor on the lower tristate buffer of the CLB associated with site 301 (see FIG. 3B) results in the value "TBUF_X4_Y12" being displayed. Thus, the uniform coordinates of each logic block are easily determined by the user.

Those having skill in the relevant arts of the invention will now perceive various modifications and additions that may be made as a result of the disclosure herein. All such modifications and additions are deemed to be within the scope of the invention, which is to be limited only by the appended claims and their equivalents.

What is claimed is:

1. A method of designating circuit element positions for a non-uniform array of logic blocks, the method comprising:
   creating a uniform site map;
   assigning a uniform coordinate system to the uniform site map; and
   mapping the non-uniform array of logic blocks to the uniform site map.

2. The method of claim 1, wherein the non-uniform array of logic blocks forms at least a portion of a Field Programmable Gate Array.

3. The method of claim 2, wherein the logic blocks include CLBs.

4. The method of claim 2, wherein the logic blocks include slices.

5. The method of claim 2, wherein the logic blocks include tristate buffers.

6. The method of claim 2, wherein the logic blocks include RAM blocks.

7. The method of claim 2, wherein the logic blocks include multiplier blocks.

8. A method of designating circuit element positions for a non-uniform array of logic blocks, the method comprising:
   creating a uniform site map;
   assigning a uniform coordinate system to the uniform site map;
   mapping the non-uniform array of logic blocks to the uniform site map; and
   assigning relative location constraints to a plurality of logic blocks in the non-uniform array of logic blocks using the uniform coordinate system.

9. The method of claim 8, wherein the plurality of logic blocks includes logic blocks of at least two different types.

10. The method of claim 8, wherein the plurality of logic blocks includes logic blocks of at least two different sizes.

11. The method of claim 8, wherein the non-uniform array of logic blocks forms at least a portion of a Field Programmable Gate Array.

12. The method of claim 11, wherein the plurality of logic blocks includes CLBs.

13. The method of claim 11, wherein the plurality of logic blocks includes slices.

14. The method of claim 11, wherein the plurality of logic blocks includes tristate buffers.

15. The method of claim 11, wherein the plurality of logic blocks includes RAM blocks.

16. The method of claim 11, wherein the plurality of logic blocks includes multiplier blocks.

17. The method of claim 8, further comprising:

generating a relationally placed macro (RPM) from the plurality of logic blocks.

18. The method of claim 17, wherein generating an RPM includes normalizing the relative location constraints.

19. Computer-readable media comprising computer software for designating circuit element positions for a non-uniform array of logic blocks, the computer software comprising:

means for creating a uniform site map;

means for assigning a uniform coordinate system to the uniform site map; and means for mapping the non-uniform array of logic blocks to the uniform site map.

20. The computer-readable media of claim 19, the computer software further comprising:

means for assigning relative location constraints to a plurality of logic blocks in the non-uniform array of logic blocks using the uniform coordinate system.

21. The computer-readable media of claim 20, the computer software further comprising:

means for generating an RPM from the plurality of logic blocks.

* * * * *